(12) United States Patent
Nakano et al.

(10) Patent No.: US 11,112,189 B2
(45) Date of Patent: Sep. 7, 2021

(54) COLD PLATE AND MANUFACTURING METHOD OF COLD PLATE

(71) Applicant: Fujikura Ltd., Tokyo (JP)

(72) Inventors: Yuta Nakano, Tokyo (JP); Yuji Saito, Tokyo (JP)

(73) Assignee: Fujikura Ltd., Tokyo (JP)

( * ) Notice: Subject to any disclaimer, the term of this patent is extended or adjusted under 35 U.S.C. 154(b) by 8 days.

(21) Appl. No.: 16/514,282

(22) Filed: Jul. 17, 2019

(65) Prior Publication Data

US 2020/0025466 A1 Jan. 23, 2020

(30) Foreign Application Priority Data

Jul. 19, 2018 (JP) .............................. JP2018-135523

(51) Int. Cl.
| | |
|---|---|
| *F28F 7/00* | (2006.01) |
| *F28F 3/04* | (2006.01) |
| *H01L 23/367* | (2006.01) |
| *H01L 21/48* | (2006.01) |
| *H01L 23/473* | (2006.01) |

(52) U.S. Cl.
CPC .......... *F28F 3/048* (2013.01); *H01L 21/4882* (2013.01); *H01L 23/3672* (2013.01); *H01L 23/473* (2013.01); *F28F 2215/04* (2013.01)

(58) Field of Classification Search
CPC ... F28F 3/048; F28F 2215/04; H01L 21/4882; H01L 23/3672; H01L 23/473
USPC ....................................................... 165/80.4
See application file for complete search history.

(56) References Cited

U.S. PATENT DOCUMENTS

| | | | | |
|---|---|---|---|---|
| 6,477,045 | B1 * | 11/2002 | Wang | ..................... H01L 23/467 361/700 |
| 10,739,084 | B2 * | 8/2020 | Tsai | .................... H05K 7/20272 |
| 10,823,511 | B2 * | 11/2020 | Vargas | ................... F28D 9/0093 |
| 2002/0012825 | A1 * | 1/2002 | Sasahara | ............. H01M 8/0289 429/482 |
| 2002/0112846 | A1 * | 8/2002 | Noda | ......................... F28F 3/02 165/80.3 |
| 2006/0096742 | A1 * | 5/2006 | Bhatti | ................. F28D 15/0266 165/104.33 |
| 2006/0219388 | A1 * | 10/2006 | Terakado | ................... F28F 3/12 165/80.4 |
| 2007/0050980 | A1 * | 3/2007 | Vetter | .................... B23K 11/14 29/890.043 |

(Continued)

FOREIGN PATENT DOCUMENTS

| | | | |
|---|---|---|---|
| JP | 2010123881 | A * | 6/2010 |
| JP | 2010123881 | A | 6/2010 |

*Primary Examiner* — Claire E Rojohn, III
(74) *Attorney, Agent, or Firm* — Osha Bergman Watanabe & Burton LLP

(57) ABSTRACT

A cold plate includes: a base plate including a plurality of fins aligned in parallel; and a cover that covers the plurality of fins and that forms an internal space between the base plate and the cover. The plurality of fins includes: a first fin group in which a plurality of first fins having a first width are disposed on the base plate with a fixed gap in a parallel direction between each of the first fins and a second fin group in which a plurality of second fins having a width wider than the first width are disposed on the base plate with the fixed gap in the parallel direction between each of the second fins. The second fin group is disposed on both sides of the first fin group.

2 Claims, 4 Drawing Sheets

(56) References Cited

U.S. PATENT DOCUMENTS

| | | | |
|---|---|---|---|
| 2010/0012294 A1* | 1/2010 | Bezama | F28F 3/12 |
| | | | 165/80.4 |
| 2013/0220587 A1* | 8/2013 | Tamura | F28F 3/086 |
| | | | 165/185 |
| 2014/0027102 A1* | 1/2014 | Antel, Jr. | F28F 13/003 |
| | | | 165/185 |
| 2014/0046248 A1* | 2/2014 | Fini | F24H 1/102 |
| | | | 604/29 |
| 2015/0357258 A1* | 12/2015 | Fitzgerald | H01L 23/3675 |
| | | | 257/713 |
| 2015/0361922 A1* | 12/2015 | Alvarez | F28D 9/0081 |
| | | | 165/185 |
| 2016/0273842 A1* | 9/2016 | Machler | F28F 3/048 |
| 2017/0097196 A1* | 4/2017 | Yoo | H01L 23/3672 |
| 2018/0041136 A1* | 2/2018 | Tokuyama | H01L 23/3675 |
| 2018/0240735 A1* | 8/2018 | Karidis | B23K 1/0014 |
| 2018/0332734 A1* | 11/2018 | Bandorawalla | G06F 1/20 |
| 2019/0385925 A1* | 12/2019 | Walczyk | H01L 23/46 |
| 2020/0025466 A1* | 1/2020 | Nakano | H01L 21/4882 |
| 2020/0321224 A1* | 10/2020 | Kubota | B23K 1/0008 |

* cited by examiner

COLD PLATE AND MANUFACTURING METHOD OF COLD PLATE

CROSS-REFERENCE TO RELATED APPLICATIONS

This application claims priority to Japanese Patent Application No. 2018-135523, filed on Jul. 19, 2018, the entire content of which is incorporated herein by reference.

BACKGROUND

Field of the Invention

The present invention relates to a cold plate and a manufacturing method of a cold plate.

Description of Related Art

In the related art, a cold plate as disclosed in Japanese Unexamined Patent Application, First Publication No. 2010-123881 is known. The cold plate includes a base plate having a plurality of fins aligned in parallel, and a cover which covers the plurality of fins so as to form an internal space between the base plate and the cover. The cover has a refrigerant inlet and a refrigerant outlet which communicate with the internal space. According to the cold plate, a refrigerant flowing into the internal space from the refrigerant inlet flows out of the refrigerant outlet through a flow path formed in the plurality of fins. In this manner, the base plate can be cooled by taking away heat from the base plate.

Incidentally, according to this type of the cold plate, the cover covering the plurality of fins is brazed to the base plate.

However, when the cover covers the plurality of fins, the outer fin tends to come in contact with the cover, thereby there is a possibility that the fin may be bent due to the contact. If the outer fin is bent, a large gap is formed between the cover and the outer fin, thereby causing the refrigerant to flow only through the large gap (that is, a bypass flow occurs). Consequently, there is a possibility that the cooling performance of a cold plate may become poor.

SUMMARY

One or more embodiments of the present invention provide a cold plate and a manufacturing method of a cold plate that can prevent the reduction of cooling performance.

According to one or more embodiments of the present invention, a cold plate is provided including a base plate which has a plurality of fins aligned in parallel, and a cover which is configured to cover the plurality of fins and form an internal space between the base plate and the cover. The plurality of fins have a first fin group in which a plurality of first fins having a first width are formed with a fixed gap in a parallel direction, and a second fin group in which a plurality of second fins having a width wider than the first width are formed with the fixed gap in the parallel direction. The second fin group is formed on both sides of the first fin group.

In the cold plate, the cover may be joined to the base plate by using a brazing material, and the gap between the second fins may be filled with the brazing material.

According to one or more embodiments of the present invention, there is provided a manufacturing method of a cold plate including a base plate which has a plurality of fins aligned in parallel, and a cover which is configured to cover the plurality of fins and form an internal space between the base plate and the cover. The plurality of fins have a first fin group in which a plurality of first fins having a first width are formed with a fixed gap in a parallel direction, and a second fin group in which a plurality of second fins having a width wider than the first width are formed with the fixed gap in the parallel direction. The second fin group is formed on both sides of the first fin group. The manufacturing method includes forming cutout portions on the base plate so as to cut out the plurality of fins, forming the first fin group while making both end portions of the cutout portion remain as cutting allowances, and forming the second fin group in each of the cutting allowances of both the end portions, after forming the first fin group.

According to one or more embodiments of the present invention, it is possible to provide the cold plate and the manufacturing method of the cold plate which can suppress the reduction of cooling performance.

DETAILED DESCRIPTION

Hereinafter, a cold plate and a manufacturing method of a cold plate according to one or more embodiments will be described with reference to the drawings. In the respective drawings used for the following description, scales are appropriately changed so that a shape of each member has a recognizable size.

Figure 1:
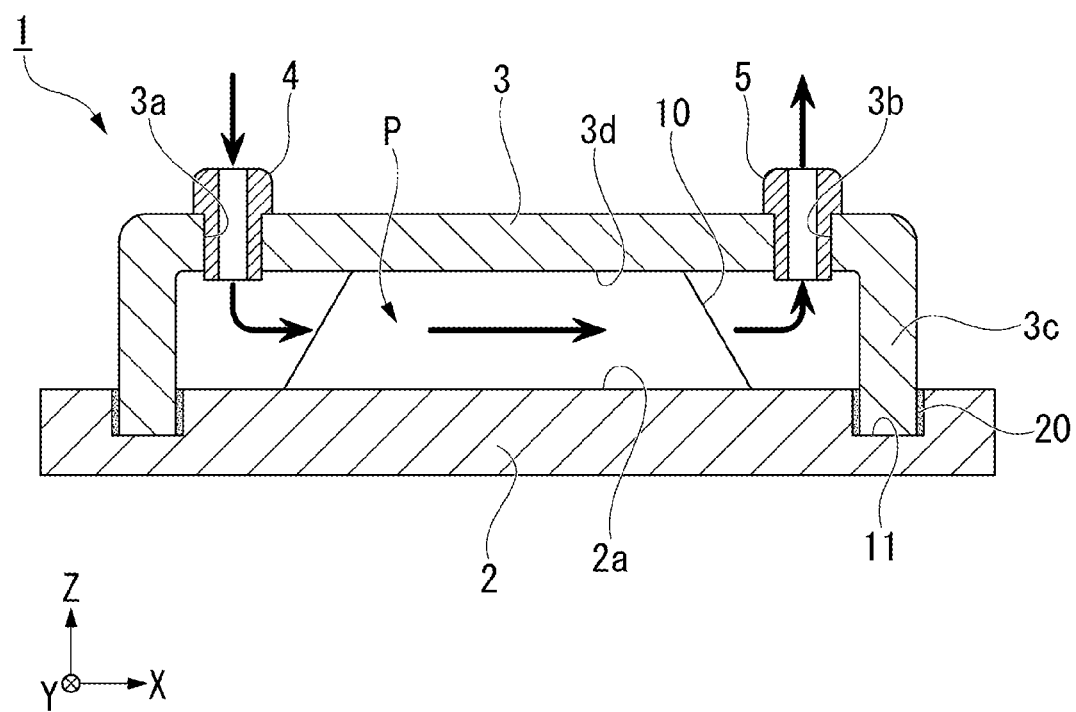
FIG. 1 is a sectional view of a cold plate 1 according to one or more embodiments of the present invention.
Figure 2:
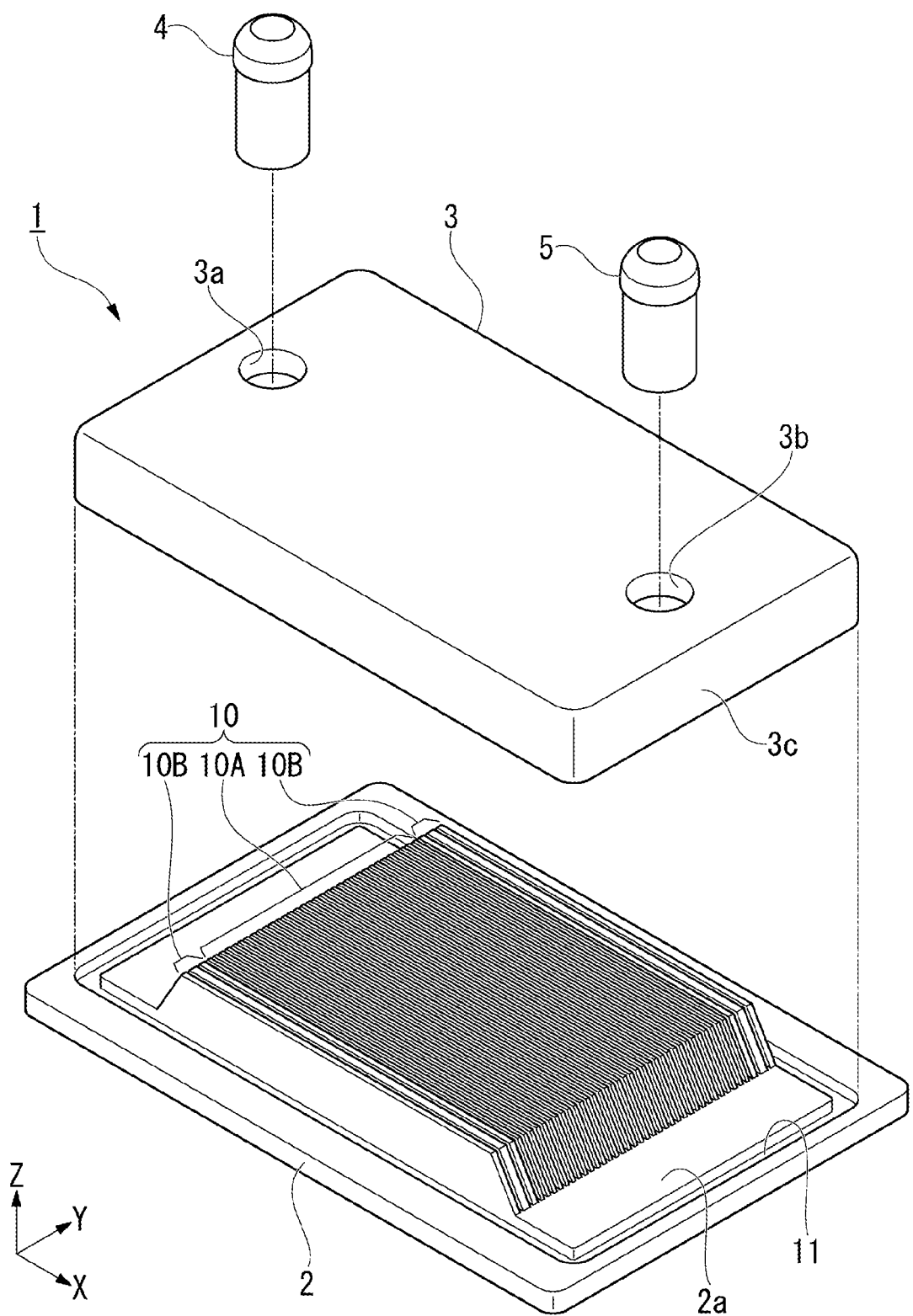
FIG. 2 is an exploded perspective view of the cold plate 1 according to one or more embodiments of the present invention.

FIG. 1 is a sectional view of a cold plate 1 according to one or more embodiments. FIG. 2 is an exploded perspective view of the cold plate 1 according to one or more embodiments.

As shown in FIGS. 1 and 2, the cold plate 1 includes a base plate 2 and a cover 3.

As shown in FIG. 2, the base plate 2 has a plurality of fins 10 aligned in parallel. Through-holes 3a and 3b are formed in the cover 3, a refrigerant inlet pipe 4 is connected to the through-hole 3a, and a refrigerant outlet pipe 5 is connected to the through-hole 3b. As shown in FIG. 1, a refrigerant flows into the cold plate 1 via the refrigerant inlet pipe 4, passes through the cold plate 1, and flows out via the refrigerant outlet pipe 5.

Here, according to one or more embodiments, an XYZ orthogonal coordinate system is set so as to describe a positional relationship of each configuration. An X-axis direction represents a direction in which the plurality of fins 10 extend and the refrigerant flows (hereinafter, referred to as a flow path direction). In the flow path direction, a side on which the refrigerant inlet pipe 4 is located will be referred to as an upstream side, and a side on which the refrigerant outlet pipe 5 is located will be referred to as a downstream side. A Y-axis direction represents a direction in which the pluralities of fins 10 are aligned in parallel (hereinafter, referred to as a parallel direction). In addition, a Z-axis direction will be referred to as an upward-downward direction. The cover 3 side in the upward-downward direction will be referred to as an upper side, and the base plate 2 side will be referred to as a lower side.

For example, the base plate 2 is formed of a material having high thermal conductivity, such as copper and aluminum. For example, a heating element such as a CPU is brought into contact with the base plate 2, thereby causing the base plate 2 to take heat away from the heating element. In this manner, the heating element can be cooled by transferring the heat to the refrigerant via the fins 10. For example, as the refrigerant, it is possible to appropriately use a known compound in addition to water and alcohol.

A groove 11 recessed downward is formed in a peripheral edge portion of an upper surface 2a of the base plate 2. The groove 11 is formed in a substantially rectangular shape in a plan view. The plurality of fins 10 extend upward from a portion located inside the groove 11 on the upper surface 2a of the base plate 2. The plurality of fins 10 are formed in a trapezoidal shape when viewed in the parallel direction (Y-axis direction) shown in FIG. 1.

The cover 3 is formed in a box shape which is open downward and covers the pluralities of fins 10. The cover 3 is formed in a substantially rectangular shape in a plan view. A peripheral wall 3c of the cover 3 engages with the groove 11 of the base plate 2. In this manner, the cover 3 is aligned with respect to the base plate 2. The peripheral wall 3c of the cover 3 is joined to the groove 11 by using a brazing material 20. The cover 3 may adopt any metal material as long as the metal material can be brazed to the base plate 2.

The refrigerant inlet pipe 4 and the refrigerant outlet pipe 5 are disposed by penetrating a top wall of the cover 3 in the upward-downward direction. The refrigerant inlet pipe 4 is located on an upstream side across the plurality of fins 10 in the flow path direction and the refrigerant outlet pipe 5 is located on a downstream side across the plurality of fins 10 in the flow path direction. In addition, an internal space having the plurality of fins 10 arranged therein is formed between the base plate 2 and the cover 3. Then, as shown in FIG. 1, a flow path P of the refrigerant is formed inside the plurality of fins 10.

The flow path P is a space surrounded by a wall surface where the two adjacent fins 10 face each other in the parallel direction, an upper surface 2a of the base plate 2, and a lower surface 3d on the top wall of the cover 3. The lower surface 3d of the cover 3 is contacted with the fins 10. The lower surface 3d of the cover 3 may be not necessarily contacted with the fins 10. The refrigerant inlet pipe 4 and the refrigerant outlet pipe 5 communicate with the internal space having the flow path P formed therein. The refrigerant inlet pipe 4 and the refrigerant outlet pipe 5 are connected to a pump (not shown). In this manner, the refrigerant flowing from the refrigerant inlet pipe 4 flows out of the refrigerant outlet pipe 5 through the internal space and the flow path P.

Here, as shown in FIG. 2, the base plate 2 according to one or more embodiments has a first fin group 10A and a second fin group 10B. The first fin group 10A is formed in a central portion except for both end portions in the parallel direction. The second fin group 10B includes a plurality of fins having a wider width than a width of the fin forming the first fin group 10A, and is formed on both sides of the first fin group 10A in the parallel direction. That is, the base plate 2 has two second fin groups 10B.

Figure 3:
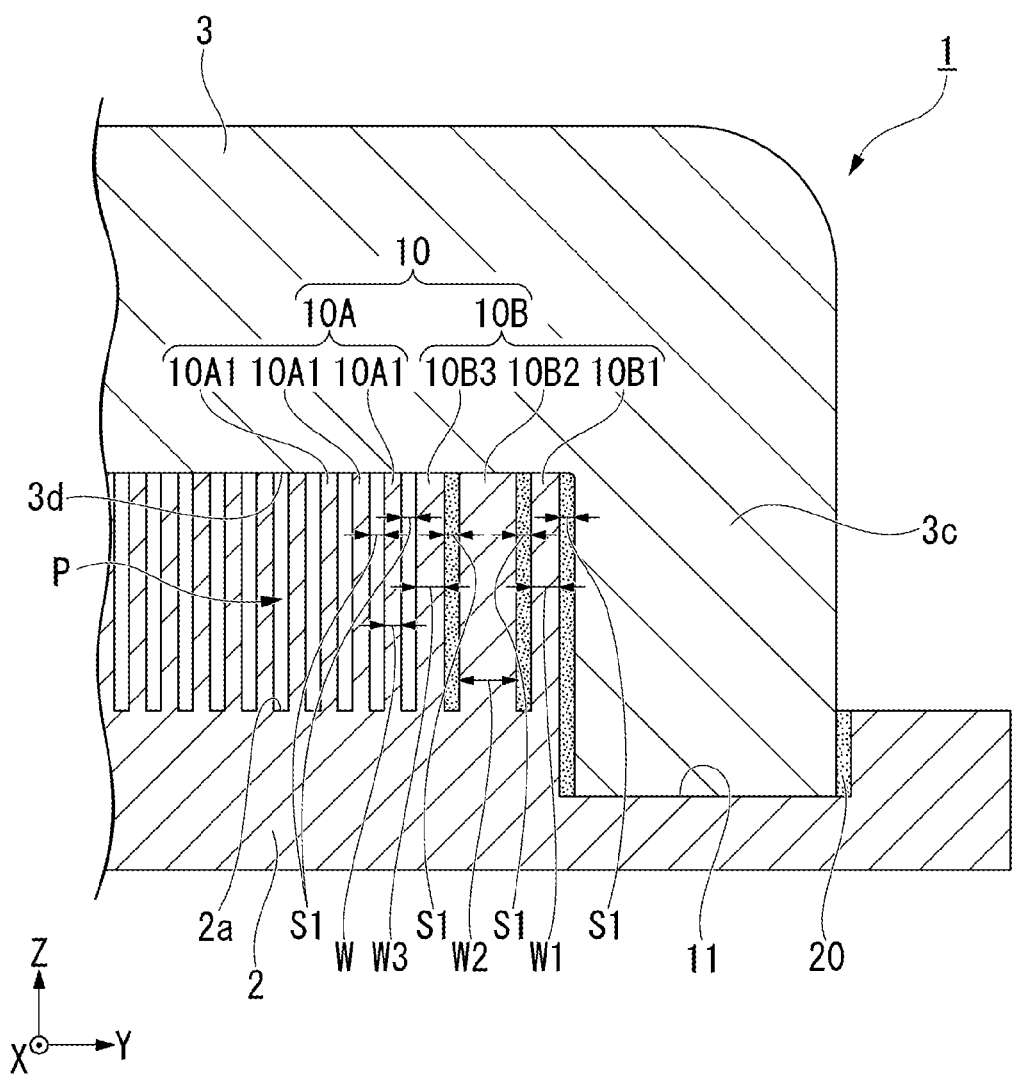
FIG. 3 is an enlarged sectional view showing a main part of the cold plate 1 according to one or more embodiments of the present invention.

FIG. 3 is an enlarged sectional view showing a main part of the cold plate 1 according to one or more embodiments.

As shown in FIG. 3, in the first fin group 10A, a plurality of first fins 10A1 having a first width W are formed with a fixed gap S1 in the parallel direction. On the other hand, in the second fin group 10B, a plurality of second fins 10B1, 10B2, and 10B3 having a wider width than the first width W are formed with the fixed gap S1 in the parallel direction. A dimension of the gap S1 of the first fins 10A1 may be the same as or different from a dimension of the gap S1 of the second fins 10B1, 10B2, and 10B3.

The second fin 10B1 is located on an outermost side in the parallel direction. An outward facing surface of the second fin 10B1 is formed to be flush with an inner surface of the groove 11. The gap S1 is formed between the second fin 10B1 and the peripheral wall 3c of the cover 3. That is, the gap S1 similar to the gap S1 of the first fin group 10A is formed so that a bypass flow of the refrigerant does not occur between the second fin 10B1 and the peripheral wall 3c of the cover 3. The second fin 10B1 has a width W1 wider than a width W of the first fin 10A1. According to one or more embodiments, the width W1 of the second fin 10B1 is at least twice the width W of the first fin 10A1.

The second fin 10B2 is located inside the second fin 10B1 in the parallel direction. The gap S1 is formed between the second fin 10B2 and the second fin 10B1. The second fin 10B2 has a width W2 wider than the width W of the first fin 10A1. According to one or more embodiments, the width W2 of the second fin 10B2 is at least four times the width W of the first fin 10A1. That is, the width W2 of the second fin 10B2 is at least twice the width W1 of the second fin 10B1.

The second fin 10B3 is located inside the second fin 10B2 in the parallel direction. The gap S1 is formed between the second fin 10B3 and the second fin 10B2. In addition, the gap S1 is formed between the second fin 10B3 and the first fin 10A1. The second fin 10B3 has a width W3 wider than the width W of the first fin 10A1. According to one or more embodiments, the width W3 of the second fin 10B3 is at least twice the width W of the first fin 10A1, that is, the same width as the width W1 of the second fin 10B1.

The gap S1 between the peripheral wall 3c and the second fin 10B1, the gap S1 between the second fin 10B1 and the second fin 10B2, and the gap S1 between the second fin 10B2 and the second fin 10B3 are filled with the brazing material 20. As the brazing material 20, the brazing material 20 is suctioned by capillary action in the gap S1 between the second fin 10B1 and the peripheral wall 3c of the cover 3. That is, the suctioned brazing material 20 is trapped in the gap S1 of the second fin group 10B.

Subsequently, a manufacturing method (hereinafter, referred to as the present method) of the cold plate 1 having the above-described configuration will be described with reference to FIGS. 4A to 4C.

Figure 4A:
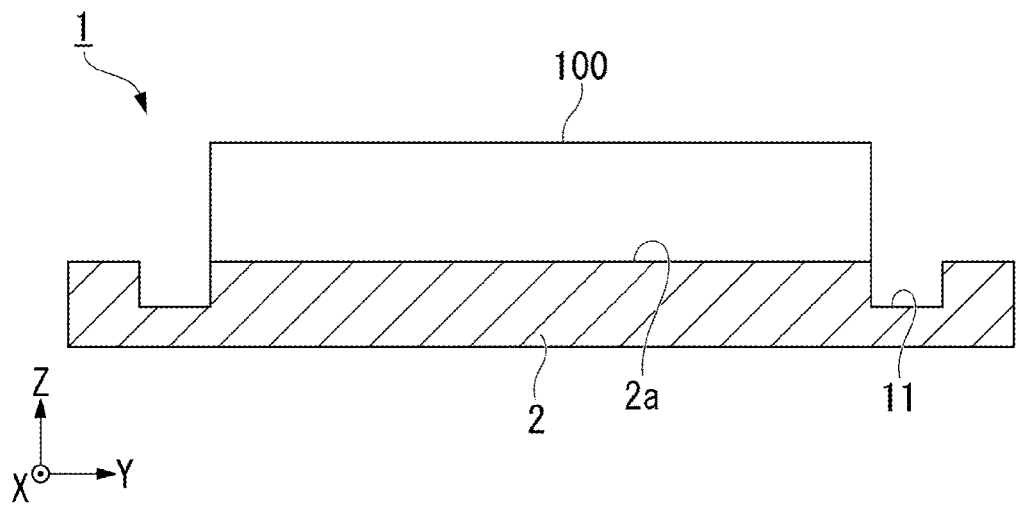
FIG. 4A is a view for describing a step of forming a plurality of fins 10 in a base plate 2 in a manufacturing method of the cold plate 1 according to one or more embodiments of the present invention.
Figure 4B:
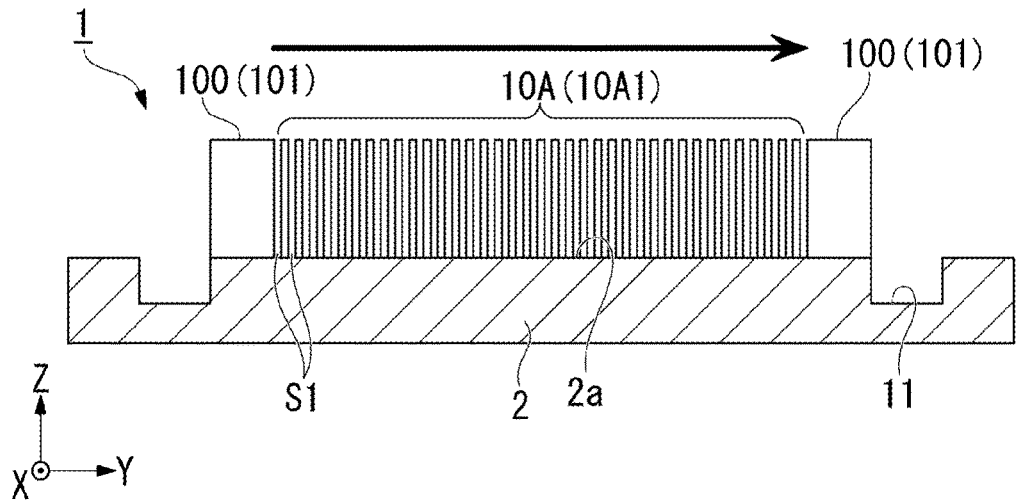
FIG. 4B is a view for describing a step of forming the plurality of fins 10 in the base plate 2 in the manufacturing method of the cold plate 1 according to one or more embodiments of the present invention.
Figure 4C:
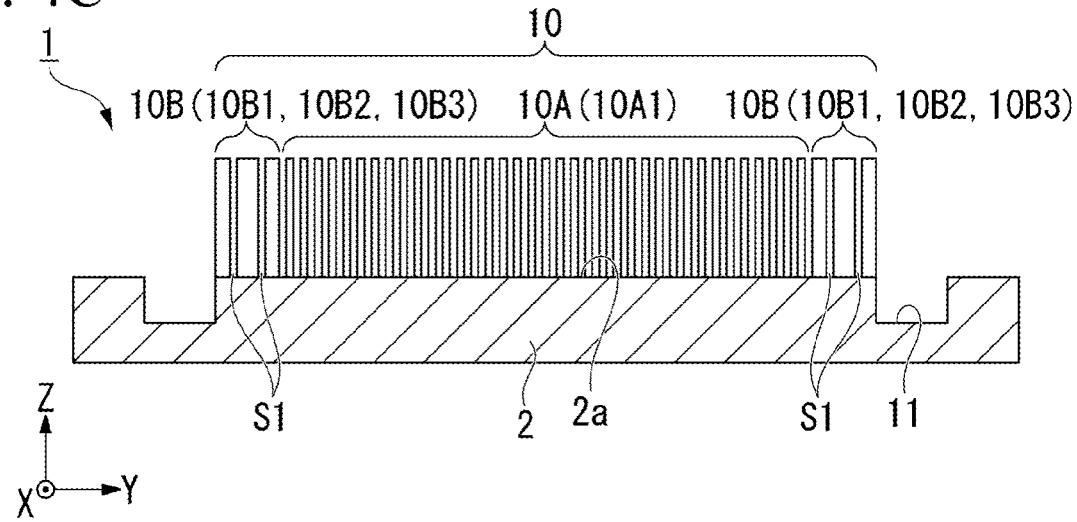
FIG. 4C is a view for describing a step of forming the plurality of fins 10 in the base plate 2 in the manufacturing method of the cold plate 1 according to one or more embodiments of the present invention.

FIGS. 4A to 4C are views for describing steps of forming the plurality of fins 10 in the base plate 2 in the manufacturing method of the cold plate 1 according to one or more embodiments.

The present method schematically includes a step of forming the base plate 2, a step of forming the cover 3, and a step of joining (brazing) the base plate 2 and the cover 3 to each other by using the brazing material 20. In the step of forming the base plate 2, a step of forming the groove 11 and a step of forming the cover 3 are well known, and thus, description thereof will be omitted. Hereinafter, a step of forming the plurality of fins 10 (first fin group 10A and second fin group 10B) in the base plate 2 will be described in detail.

According to the present method, as shown in FIG. 4A, a cutout portion 100 for cutting out the plurality of fins 10 is first formed in the base plate 2. The cutout portion 100 is a block body formed in a trapezoidal shape when viewed in the Y-axis direction and is integrally formed with the base plate 2. The cutout portion 100 is cut out from a base material for forming the base plate 2 and can be formed together with the groove 11 by means of machining.

According to the present method, as shown in FIG. 4B, both end portions (for example, 5% or less of the total width) of the cutout portion 100 in the Y-axis direction are subsequently caused to remain as cutting allowances 101, thereby forming the first fin group 10A. For example, the first fin group 10A can be formed, by cutting the cutout portion 100 with a rotating metal slitting saw and forming a plurality of recess portions (gaps S1) in the Y-axis direction. For example, the metal slitting saw forms one of the recess portions. Thereafter, the metal slitting saw rises to be shifted as much as a predetermined width to one side in the Y-axis direction, and then falls again, thereby forming another recess portion adjacent to the recess portion. This operation is repeatedly performed, thereby forming the first fin group 10A. Here, a machining error is accumulated every time the metal slitting saw forms one recess portion. The machining error can be absorbed by cutting a portion of the cutting allowance 101.

According to the present method, as shown in FIG. 4C, the second fin group 10B is subsequently formed in each of the cutting allowances 101. Similarly to the first fin group 10A, the second fin group 10B can be formed by cutting the cutting allowance 101 with the rotating metal slitting saw and forming the plurality of recess portions (gaps S1) in the Y-axis direction. The metal slitting saw forms the recess portions by being shifted in the Y-axis direction so as to have the width wider than the width for forming the first fin group 10A. Through this operation, it is possible to form the second fins 10B 1, 10B2, and 10B3 having the wider width than the width of the first fin 10A1. In addition, a volume of suctioning the brazing material 20 (to be described later) may be estimated in advance so that the number the recess portions to be formed is equivalent to the volume.

As described above, when the plurality of fins 10 are formed in the base plate 2, the brazing material 20 is located in the groove 11. The cover 3 prepared separately covers the base plate 2 and the plurality of fins 10, and the peripheral wall 3c of the cover 3 is caused to engage with groove 11.

As shown in FIG. 2, when the base plate 2 is covered with the cover 3, the peripheral wall 3c is likely to come into contact with the outer fin 10. However, the outer fin 10 is formed by the second fin group 10B having the wider width than the first fin group 10A. Therefore, even if the cover 3 comes into contact with the outer fin 10, the outer second fin group 10B is less likely to be bent. Accordingly, it is possible to prevent cooling performance from reducing by preventing the occurrence of the bypass flow of the refrigerant.

If the base plate 2 is covered with the cover 3, all of these are placed in a heating furnace so as to melt the brazing material 20. Here, as shown in FIG. 3, in order to prevent the occurrence of the bypass flow of the refrigerant, the gap S1 which is approximately the same gap between the other fins 10 is formed between the second fin 10B1 located outermost and the peripheral wall 3c of the cover 3. Then, a capillary force may be generated in the gap S1, and the brazing material may be suctioned due to the capillary force, in some cases. Here, the plurality of the gaps S1 are formed in the second fin group 10B. Accordingly, the suctioned brazing material 20 is absorbed by the gap S1 of the second fin group 10B. Therefore, it is possible to prevent brazing material clogging in the gap S1 (flow path P) of the first fin group 10A which shows cooling performance. In addition, the gap S1 between the second fin 10B1, 10B2, and 10B3 is filled with the brazing material 20, thereby improving joining strength between the base plate 2 and the cover 3.

Therefore, according to one or more embodiments described above, the following configuration is adopted. The cold plate includes the base plate 2 having the plurality of fins 10 aligned in parallel and the cover 3 that covers the plurality of fins 10 so as to form the internal space between the base plate 2 and the cover. The plurality of fins 10 has the first fin group 10A in which the plurality of first fins 10A1 having the first width W are formed with the fixed gap S1 in the parallel direction, and the second fin group 10B in which the plurality of second fin 10B1, 10B2, and 10B3 having the width wider than the first width are formed with the fixed gap S1 in the parallel direction. The second fin group 10B is formed on both sides of the first fin group 10A. In this manner, the cold plate can compatibly include a bypass flow prevention structure and a brazing material clogging prevention structure. Therefore, it is possible to obtain the cold plate 1 which can suppress the reduction of cooling performance.

While embodiments of the invention have been described and shown above, it should be understood that these are exemplary of the invention and are not to be considered as limiting. Those skilled in the art, having benefit of this disclosure, will appreciate that various additions, omissions, substitutions, and other modifications can be made without departing from the spirit or scope of the present invention. Accordingly, the scope of the invention should be limited only by the appended claims.

What is claimed is:

1. A cold plate comprising:
a base plate;
a plurality of fins that have a plate shape and that are aligned in parallel with one another on the base plate in a parallel direction; and
a cover that covers the plurality of fins and that forms an internal space between the base plate and the cover, wherein
the plurality of fins consists of a first group of fins and two second groups of fins,
each of the fins in the first group has a first width,
each of the fins in the two second groups has a second width that is wider than the first width in the parallel direction,
the fins in the first group are disposed on the base plate with a first fixed gap therebetween in a continuous adjacent grouping in the parallel direction,
the fins in each of the two second groups are disposed on the base plate with a second fixed gap therebetween in a continuous adjacent grouping in the parallel direction,
the entirety of the first group of fins is disposed on the base plate between the two second groups of fins such that the entirety of each second group of fins is respectively disposed at outermost ends of the base plate within the internal space in the parallel direction, and
no fins are disposed outside of the second groups of fins in the parallel direction.

2. The cold plate according to claim 1, wherein
the cover is joined to the base plate using a brazing material, and
the second fixed gaps are each filled with the brazing material.

* * * * *